(12) United States Patent
Yanagida

(10) Patent No.: US 6,204,558 B1
(45) Date of Patent: Mar. 20, 2001

(54) TWO BALL BUMP

(75) Inventor: Toshiharu Yanagida, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/385,957

(22) Filed: Aug. 30, 1999

(30) Foreign Application Priority Data

Sep. 1, 1998 (JP) .................................................. 10-247392

(51) Int. Cl.[7] .................................................. H01L 23/48
(52) U.S. Cl. .......................... 257/737; 257/738; 257/778
(58) Field of Search .................................... 257/737, 738, 257/778

(56) References Cited

U.S. PATENT DOCUMENTS 5,872,400 * 2/1999 Chapman et al. .................... 257/737
5,883,438 * 2/1999 Kang ..................................... 257/778

* cited by examiner

Primary Examiner—Carl Whitehead, Jr.
Assistant Examiner—Roy Potter
(74) Attorney, Agent, or Firm—Sonnenschein, Nath & Rosenthal (57) ABSTRACT

Disclosed is a bump designed to certainly moderate a thermal stress applied between a semiconductor device and a printed circuit board and enhance the strength of a bonding portion without use of a sealing resin, and a method of manufacturing the bump. The bump includes a relatively elastic first ball bump formed on an electrode pad provided on a semiconductor device; and a second ball bump formed in such a manner as to be overlapped on the first ball bump at least in the direction perpendicular to the electrode pad. The second ball bump is different in material or composition from the first ball bump and is adapted to be in contact with an eutectic solder pre-coated on a connection land of a printed circuit board.

7 Claims, 5 Drawing Sheets

TWO BALL BUMP

BACKGROUND OF THE INVENTION

The present invention relates to bumps formed on connection terminals of a semiconductor substrate for mounting a semiconductor device such as a semiconductor IC, and a method of manufacturing the bumps.

In recent years, as portable electronic equipment such as a digital video camera, a digital portable telephone, or a notebook type personal computer has been widespread, there has been a strong demand toward miniaturization, thinning and lightweightness of the portable electronic equipment.

To realize the miniaturization, thinning and lightweightness of the portable electronic equipment, it is important to improve the mounting density of parts.

In particular, with respect to a semiconductor device such as a semiconductor IC, a high density mounting technique using a flip-chip type semiconductor device has been developed and practically used in place of a conventional package type semiconductor device.

For example, mounting of such a flip-chip type semiconductor device (flip-chip mounting) is carried out by forming solder ball bumps on Al electrode pads provided on a semiconductor IC, and bringing the solder ball bumps of the semiconductor IC in a chip state into contact with connection terminals of a printed circuit board, to thereby directly mount the IC chip on the printed circuit board.

The above solder ball bumps are manufactured by making use of an electroplating process. With this process, the thickness of a solder layer formed by electroplating is affected by the surface state of an underlying layer and a slight variation in electric resistance. This causes a problem that it is basically difficult to form solder ball bumps having uniform heights in one IC chip.

On the contrary, as a method of manufacturing solder ball bumps in such a manner as to suppress a variation in height of the solder ball bumps, there has been known a method of forming a pattern of solder ball bumps by making use of film formation due to vacuum vapor deposition and lift-off of a photoresist film.

The latter method will be described with reference to FIGS. 4A to 4E.

Figure 4A:
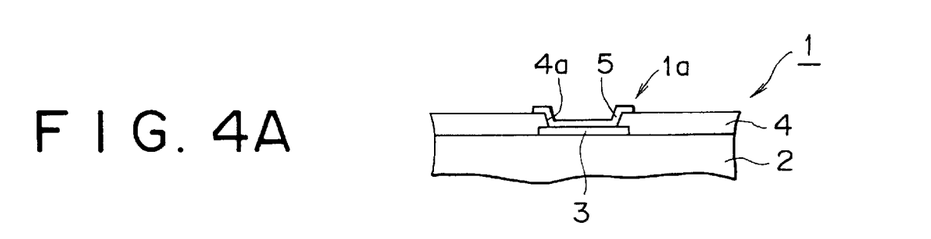
FIGS. 4A to 4E are schematic cross-sectional views illustrating sequential steps of manufacturing a solder bump in accordance with a related art manufacturing method.
Figure 4B:
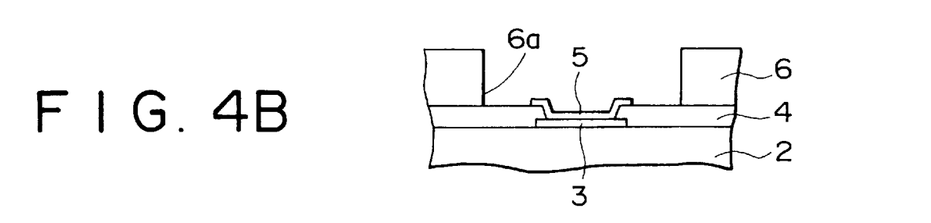

Referring first to FIG. 4A, an electrode portion 1a of a flip-chip type semiconductor IC 1 is formed as follows:

An electrode pad 3 typically made from an Al—Cu alloy is formed on a semiconductor substrate 2 typically made from silicon by sputtering, etching and the like. A surface protective film 4 typically made from silicon nitride or polyimide is formed over the entire surface of the semiconductor substrate 2 in such a manner as to cover the electrode pad 3. An opening 4a is formed in the surface protective film 4 at a region of the electrode pad 3. A metal multi-layer film 5 typically made from Cr, Cu, Au and the like, which is called a BLM (Ball Limiting Metal) film, is formed by typically sputtering in such a manner as to cover the surface of the electrode pad 3 exposed to the side surface and the bottom of the opening 4a. The electrode portion 1a is composed of these electrode pad 3, surface protective film 4, opening 4a, and BLM film 5.

To form a solder ball bump on the electrode portion 1a which is provided on the semiconductor IC 1 as described above, as shown in FIG. 4B, a resist film 6 having an opening 6a at a region of the BLM film 5 is formed.

Figure 4C:
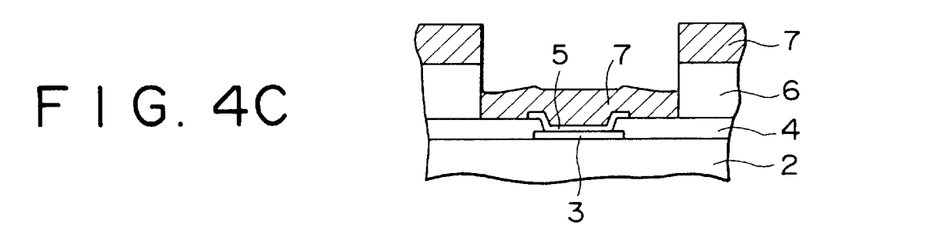

Referring to FIG. 4C, a solder vapor deposition film 7 is formed on the entire surface of the semiconductor substrate 2 via the resist film 6.

Figure 4D:
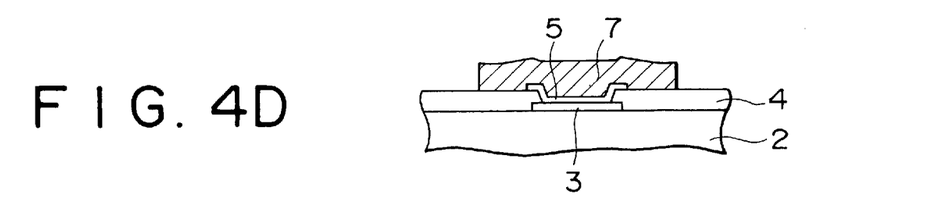

Referring to FIG. 4D, the resist film 6 is lifted-off, to remove an unnecessary portion of the solder vapor deposition film 7, whereby the solder vapor deposition film having a specific pattern is formed.

Figure 4E:
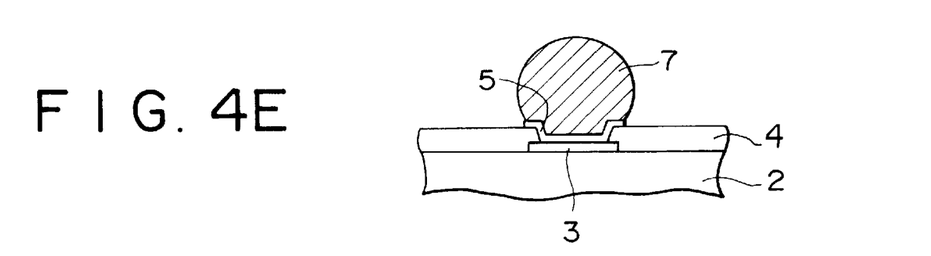

Referring to FIG. 4E, the semiconductor substrate 2 is subjected to heat-treatment, to melt the solder of the solder vapor deposition film 7, whereby an approximately spherical solder ball bump 7a is formed due to the surface tension of the solder.

In general, the formation of the solder ball bumps 7a are performed for the semiconductor ICs 1 left as a semiconductor wafer state, that is, in the state before the semiconductor wafer is cut into the individual semiconductor ICs 1.

After the solder ball bumps 7a are formed on respective electrode portions 1a provided on the semiconductor ICs 1, the wafer-like semiconductor substrate 2 is cut into the individual chip-like semiconductor ICs 1 typically by dicing.

Figure 5:
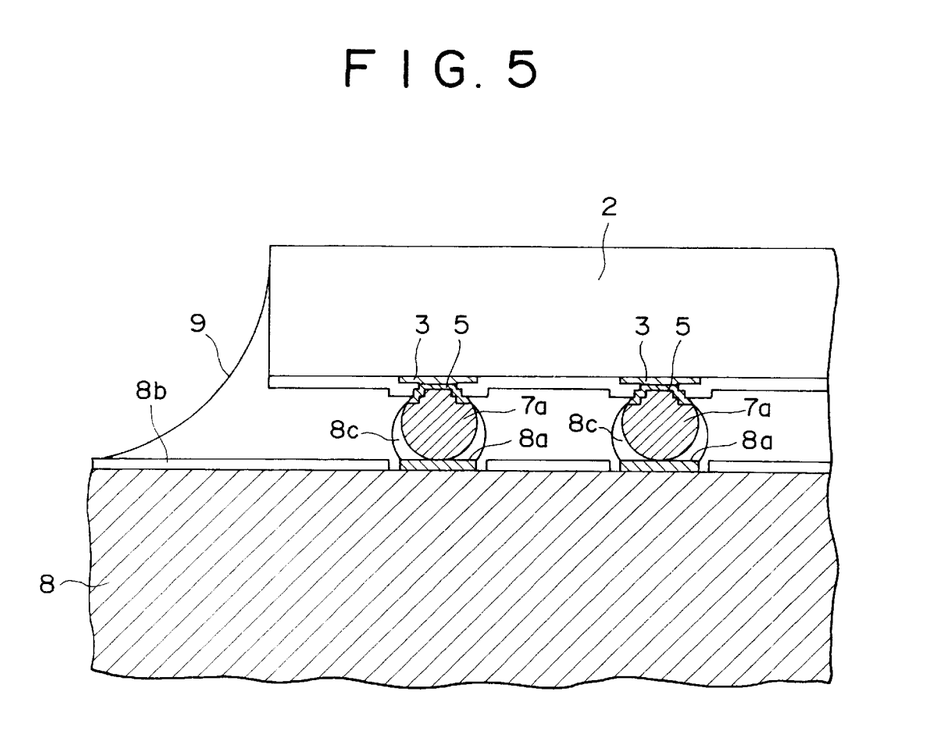
FIG. 5 is a schematic cross-sectional view showing a state in which a flip-chip type semiconductor IC including bumps manufactured by the manufacturing method shown in FIGS. 4A to 4E.

Referring to FIG. 5, the solder ball bumps 7a of each semiconductor IC 1 are brought into contact with lands 8a as connection portions typically made from Cu formed on a printed circuit board 8 to which the semiconductor IC 1 is to be mounted.

The surface of the printed circuit board 8 is covered with a solder resist 8b excluding the lands 8a, and regions of the lands 8a are pre-coated with an eutectic solder film 8c.

At a reflow step, the eutectic solder film 8c is melted. The melted eutectic solder permeates between the solder ball bumps 7a and the lands 8a, and cooled and hardened, whereby each ball bump 7a is soldered to the land 8a, that is, it is electrically connected thereto.

The above solder bonding between the solder ball bump 7a and the land 8a suffers thermal stress due to environmental temperature change because the thermal expansion coefficient of the semiconductor substrate 2 of the semiconductor IC 1 is different from that of the printed circuit board 8.

To be more specific, the thermal expansion coefficient of silicon forming the semiconductor substrate 2 is as small as 3.4 ppm/° C., while the thermal expansion coefficient of a glass reinforced epoxy resin based substrate generally used as the printed circuit board 8 is as large as about 15 ppm/° C. Accordingly, when thermal stress is repeatedly applied to the solder bonding portion between the solder ball bump 7a and the land 8a due to a temperature difference caused by on/off operation of the semiconductor IC 1, cracking may occur at the solder bonding portion, and at the worst case, the cracking leads to breakage, to cause electric disconnection at the solder bonding portion, thereby inducing a so-called breakage failure. That is to say, the above-described structure has a problem associated with the reliability of solder bonding.

To suppress breakage of the solder bonding portion due to thermal stress, there has been generally adopted a method in which a sealing resin 9 is injected between the semiconductor IC 1 and the printed circuit board 8 as shown in FIG. 5. In this method, the entire sealing resin 9 sustains the above-described thermal stress, to moderate the thermal stress applied to the solder bonding portion, thereby enhancing the strength against the thermal stress.

In the above method using the sealing resin 9, the semiconductor IC 1 is integrally fixed on the printed circuit board 8 by the sealing resin 9. Accordingly if the semiconductor IC 1 fails, the printed circuit board 8 on which the failed semiconductor IC 1 is mounted is exchanged as a whole, then discarded as a defective or the failed semiconductor IC 1 is forcibly peeled from the printed circuit board 8 by applying an external chemical or mechanical force thereto.

The former exchange of the printed circuit board 8 as a whole causes a problem in raising the cost while the latter forced peeling of the semiconductor IC 1 causes a problem in damaging the printed circuit board 8.

In this way, the method using the sealing resin 9 is disadvantageous in that if the semiconductor IC 1 fails, the exchange work, that is, the rework of the failed part cannot be easily performed. This is one reason why flip-chip mounting has been not widespread.

The method using the sealing resin 9 has another problem. With a tendency toward a so-called narrow pitch accompanied by miniaturization of a semiconductor device, the runabout of the sealing resin 9 having been injected between the semiconductor IC 1 and the printed circuit board 8 becomes poor, with a result that it is difficult to realize perfect injection of the sealing resin 9. The sealing resin 9 thus imperfectly injected fails to sufficiently moderate the thermal stress applied to the solder bonding portion.

SUMMARY OF THE INVENTION

An object of the present invention is to provide a bump designed to certainly moderate a thermal stress applied between a semiconductor device and a printed circuit board and enhance the strength of a bonding portion without use of a sealing resin, and to provide a method of manufacturing the bump.

To achieve the above object, according to a first aspect of the present invention, there is provided a bump or solder bump including: a relatively elastic first ball bump or first solder ball bump formed on an electrode pad provided on a semiconductor device; and a second ball bump or second solder ball bump formed in such a manner as to be overlapped on the first ball bump or first solder ball bump at least in the direction perpendicular to the electrode pad, the second ball bump or second solder ball bump being different in material or composition from the first ball bump or first solder ball bump and being adapted to be in contact with a solder pre-coated on a connection land of a printed circuit board.

To achieve the above object, according to a second aspect of the present invention, there is provided a method of manufacturing a bump or solder bump, including: a first step of forming a relatively elastic first ball bump or first solder ball bump on an electrode pad provided on a semiconductor device; and a second step of forming a second ball bump or second solder ball bump on the first ball bump or first solder ball bump at least in the direction perpendicular to the electrode pad, the second ball bump or second solder ball bump being different in material or composition from the first ball bump or first solder ball bump and being adapted to be in contact with a solder pre-coated on a connection land of a printed circuit board.

In the bump or solder bump and the manufacturing method thereof according to the present invention, a core portion of the bump or solder bump is formed of the relatively elastic first ball bump or first solder ball bump, and accordingly even if there occurs a thermal stress due to a difference in thermal expansion coefficient between a silicon chip constituting the semiconductor substrate on which the semiconductor device is provided and the printed circuit board, the thermal stress is moderated by the elastic deformation of the bump or solder bump.

Further, a portion of the bump or solder bump, which is to be brought into contact with the solder pre-coated on the connecting land of the printed circuit board, is configured by the second ball bump or second solder ball bump different in material or composition from the first ball bump or first solder ball bump, and accordingly if the second ball bump or second solder ball bump is made from a solder having a good wettability to the solder pre-coated on the connecting land, the bump or solder bump can be certainly bonded to the connecting land.

Accordingly, upon mounting of the semiconductor device on the printed circuit board, the thermal stress is moderated and the bonding strength is enhanced. This makes it possible to significantly reduce a mounting failure and to improve the reliability of the bonding portion of the bump or solder bump.

The manufacturing method of the present invention, preferably, further includes a third step of forming a resin layer on the surface, on the electrode pad side, of the semiconductor device in such a manner as to cover the first ball bump or first solder ball bump. With this configuration, since a relatively weak root portion of the ball bump or solder ball bump, that is, the first ball bump or first solder ball bump and its neighborhood are reinforced by the resin, the thermal stress is moderated by the resin.

Since the formation of the resin layer is performed before mounting of the semiconductor device on the printed circuit board, it is not required to inject the resin between the semiconductor device and the printed circuit board after mounting of the semiconductor device, resulting in the improved productivity. Further, since the resin layer is not brought into contact with the printed circuit board, if the semiconductor device fails after mounting thereof, the failed semiconductor device can be easily removed from the printed circuit board, to facilitate the rework, thereby improving the reliability of the bump or solder bump.

Since the resin layer is formed on the semiconductor device before the semiconductor device is mounted on the printed circuit board, even if the semiconductor device has a narrow pitch structure for enhancing the level of integration, it is possible to certainly fill spaces between the bumps or solder bumps with the resin, and hence to certainly fixedly hold the bumps or solder bumps with the resin.

In the manufacturing method of the present invention, preferably, the thickness of the resin layer is in a range of the height of the first ball bump or first solder ball bump or less. With this configuration, the amount of the resin which inevitably remains on the top portion of the first ball bump or the first solder ball bump at the manufacturing step, can be minimized. As a result, it is possible to eliminate the inconvenience that the electrical conduction between the first ball bump or first solder ball bump and the second ball bump or second solder ball bump is obstructed by the remaining resin.

In the manufacturing method of the present invention, preferably, the third step is performed after the first step and a fourth step of polishing a surface portion of the first solder ball bump projecting from the surface of the resin layer is performed after the third step. With this configuration, the resin component remaining on the top portion of the first solder ball bump and its neighborhood is removed by polishing, and also the surface of the top portion of the first solder ball bump is plarized by polishing to become a clean plane.

Accordingly, the bonding characteristic between the first solder ball bump and the second solder ball bump is improved, to enhance the electrical conduction therebetween, thereby reducing the electrical resistance of the bonding portion; and the heights of the finished solder bumps are equalized, to thereby reduce a connection failure between each solder bump and the associated connecting land, that is a mounting failure.

In the fabrication method of the present invention, preferably, after formation of the resin layer at the third step, the formation of the second solder ball bump at the second step is performed by a printing process, a plating process or a transfer process. With this configuration, after the first solder ball bumps are fixedly held by the resin, the second solder ball bumps having uniform heights can be easily formed on the first solder ball bumps. This makes it possible to further reduce a mounting failure and hence to improve the reliability of the solder bumps.

In the manufacturing method of the present invention, preferably, the first, second and third steps are performed for the semiconductor device formed on a semiconductor substrate in a wafer state. With this configuration, the formation of the first ball bump or first solder ball bump, formation of the resin layer, and formation of the second ball bump or second solder ball bump are performed for each semiconductor device before the semiconductor device is cut from the semiconductor wafer. In other words, these works are not required to be performed for the individual semiconductor devices after the semiconductor devices are cut from the semiconductor wafer. This makes it possible to handle a number of the semiconductor devices at a time and hence to further improve the productivity.

DETAILED DESCRIPTION OF THE PREFERRED EMBODIMENT

Hereinafter, preferred embodiments of the present invention will be described in detail with reference to FIGS. 1A to 3.

FIGS. 1A to 1E show a first embodiment of a method of manufacturing solder bumps according to the present invention.

Figure 1A:
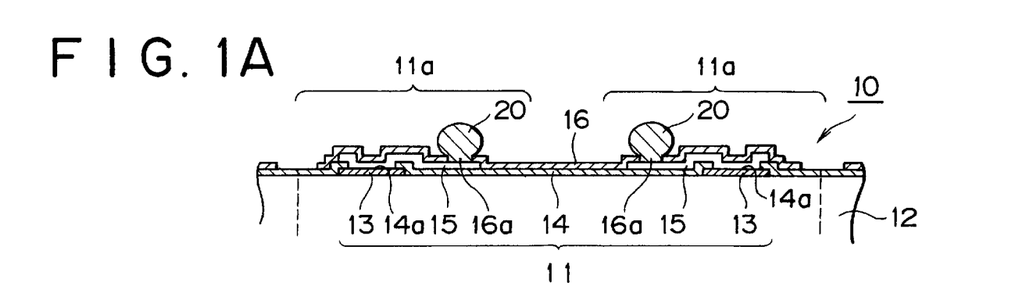
FIGS. 1A to 1E are schematic cross-sectional views illustrating sequential steps of manufacturing a bump according to a first embodiment of the present invention.

Referring to FIG. 1A, there is shown one of a plurality of flip-chip type semiconductor ICs 11 provided on a semiconductor wafer 10.

The flip-chip type semiconductor IC 11 has, as shown in FIG. 1A, two electrode portions 11a each of which is formed as follows:

An electrode pad 13 made from an Al—Cu alloy is formed on a semiconductor substrate 12 made from silicon by sputtering, etching and the like. A surface protective film 14 made from silicon nitride or polyimide is formed over the entire surface of the semiconductor substrate 12 in such a manner as to cover the electrode pad 13. An opening 14a is formed in the surface protective film 14 at a region of the electrode pad 13. A metal multi-layer film, that is, BLM film 15 made from Cr, Cu, Au and the like is formed by sputtering in such a manner as to cover the surface of the electrode pad 13 exposed to the side surface and the bottom of the opening 14a. A polyimide film 16 having an opening 16a at a region of the BLM film 15 is formed over the entire surface of the semiconductor substrate 12. The electrode portion 11a is composed of these electrode pad 13, surface protective film 14, opening 14a, BLM film 15, and the polyimide film 16.

A spherical first solder ball bump 20 is formed on each electrode portion 11a of each semiconductor IC 11 of the semiconductor wafer 10. The ball bump 20 is desirable to have a high elasticity, and in this embodiment, the ball bump 20 is made from a high melting point solder.

The first solder ball bump 20 is formed on the BLM film 15 exposed from the opening 16a of the polyimide film 16.

The high melting point solder contains about 97% of Pb and about 3% of Sn, and has a high melting point and a relatively high elasticity.

Figure 1B:
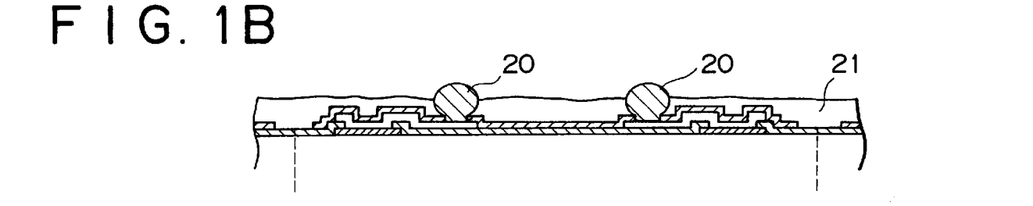

Referring to FIG. 1B, the entire surface of the semiconductor wafer 10 is covered with an epoxy region 21 by spin-coating. The semiconductor wafer 10 is then heat-treated at about 150° C. for about 5 hrs, whereby the resin 21 is cured.

The thickness of the resin layer 21 is selected to be nearly equal to or less than the height of the first solder ball bump 20. Accordingly, the top portion of the first solder ball bump 20 projects from the surface of the resin layer 21.

Figure 1C:
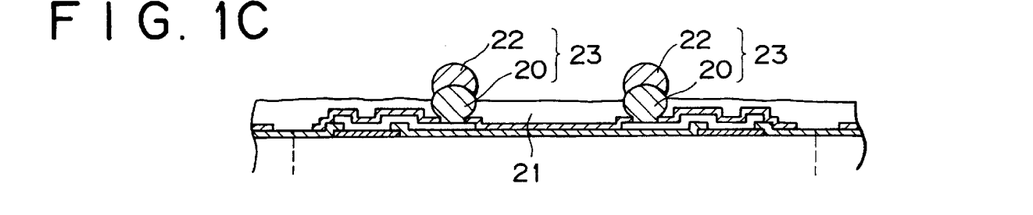

Referring to FIG. 1C, a patterned eutectic solder film is formed by screen printing, to form a second solder ball bump 22 on the top portion of the first solder ball bump 20.

The eutectic solder contains about 40% of Pb and about 60% of Sn, and has a melting point of about 200° C. which is lower than that of the above-described high melting point solder.

The semiconductor wafer 10 is heated in a temperature range in which only the eutectic solder is melted but the high melting point solder is not melted, specifically, at a temperature in a range of 200° C. to 250° C., whereby the second solder ball bump 22 is melted so that the shape thereof becomes a ball-like shape by its surface tension, and it is also hardened to be bonded to the first solder ball bump 20. In this way, a solder bump 23 having a stacked structure of the first and second solder ball bumps 20 and 22 is formed.

The semiconductor substrate 12 in the wafer state is then cut into the individual chip-like semiconductor ICs 11 by dicing. The semiconductor IC 11 is thus accomplished.

Figure 1D:
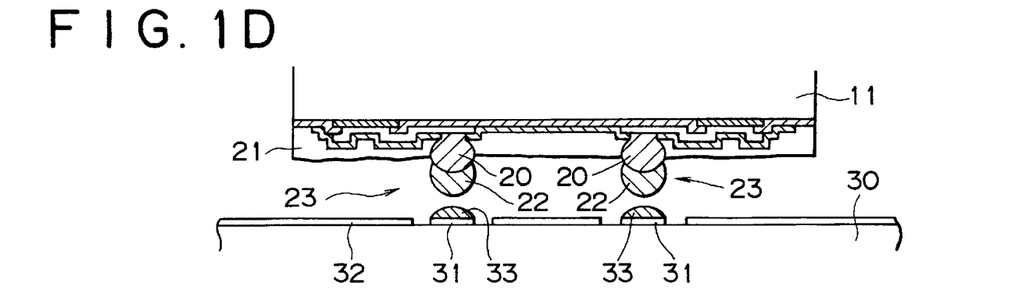

The semiconductor IC 11 thus manufactured is mounted on a printed circuit board 30 in the following procedure:

Referring to FIG. 1D, the flip-chip type semiconductor IC 11 is set such that each solder bump 23 faces to the associated one of lands 31 as connecting portions made from Cu formed on the printed circuit board 30.

The surface of the printed circuit board 30 is covered with a solder resist 32 excluding the surfaces of the lands 31, and the regions of the lands 31 are precoated with an eutectic solder film 33.

Figure 1E:
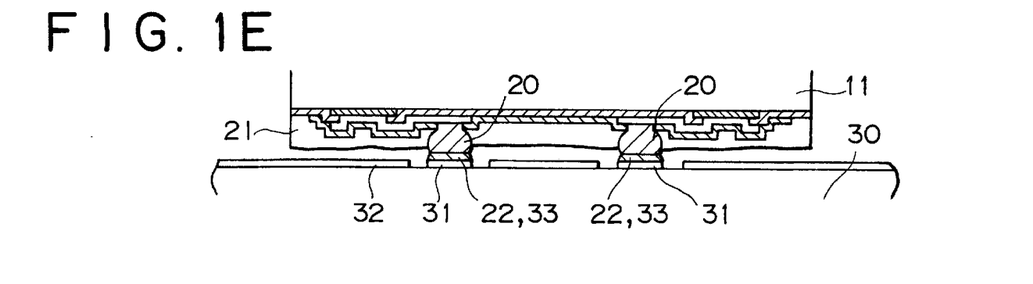

The semiconductor IC 11 is moved close to the printed circuit board 30 until each solder bump 23 is brought into contact with the associated one of the lands 31. Then, at a so-called reflow step, the eutectic solder film constituting the second solder ball bumps 22 and the eutectic solder film 33 pre-coated on the lands 31 formed on the printed circuit board 30 are melted, to be thus bonded to each other.

In this way, the flip-chip mounting of the flip-chip type semiconductor IC 11 to the printed circuit board 30 is terminated.

The embodiment having the above-described configuration has the following advantages:

Since the second solder ball bump 22 formed of the eutectic solder film has desirable wettability to the eutectic solder film 33 pre-coated on the lands 31, it is desirably familiar to and strongly bonded to the eutectic solder film 33. As a result, the second solder ball bump 22 is certainly solder-bonded to the eutectic solder film 33.

Since the first solder ball bumps 20 are fixedly held by the resin layer 21, even if a thermal stress is applied between the semiconductor substrate 12 and the printed circuit board 30 due to environmental temperature change after mounting, the resin layer 21 holding the solder bumps 23 sustains the thermal stress as a whole and the first solder ball bumps 20 having a relatively high elasticity are elastically deformed, whereby the thermal stress is moderated. As a result, it is possible to prevent breakage of the bonding portions of the solder bumps 23 due to the thermal stress and hence to improve the reliability of the solder bumps.

Since the resin layer 21 is formed on the surface, on the electrode pad 13 side, of the semiconductor IC 11 before the semiconductor IC 11 is mounted to the printed circuit board 30, the resin layer 21 is not brought into contact with the surface of the printed circuit board 30; and since unlike the related art method, it is not required to inject the resin 21 between the semiconductor IC 11 and the printed circuit board 30, even if the semiconductor IC 11 has a narrow pitch structure, the entire surface of the semiconductor IC 11 is certainly covered with the resin layer 21. This makes it possible to certainly moderate a thermal stress, and hence to improve the durability against the thermal stress.

As described above, according to this embodiment, the reliability and durability of the flip-chip mounting of the semiconductor IC 11 to the printed circuit board 30 is significantly improved.

While the first and second ball bumps made from the lead-containing solders different in composition are used in the above-described embodiment, they may be made from lead-free solders different in composition. Even in this case, the same effect can be obtained.

To be more specific, the first ball bump may be made from a solder of a metal other than lead, and the second ball may be made from a solder of an alloy not containing lead. For example, the first ball bump may be made from a solder of Cu, and the second ball bump may be made from a solder of an alloy containing 99.3% of Sn and 0.7% of Cu. The Cu ball is preferably subjected to Au plating for improving the electric contact characteristic.

Further, the first ball bump may be made from a solder of Ni, and the second ball bump may be made from a solder of an alloy containing 96.5% of Sn and 3.5% of Ag. Even in the case, the Ni ball is preferably subjected to Au plating.

FIGS. 2A to 2F show a second embodiment of the method of manufacturing solder bumps according to the present invention.

Figure 2A:
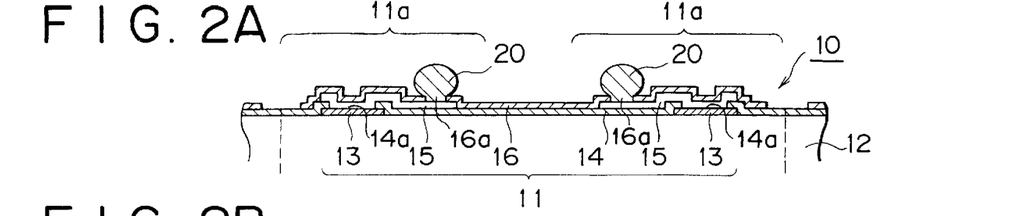
FIGS. 2A to 2F are schematic cross-sectional views illustrating sequential steps of manufacturing a bump according to a second embodiment of the present invention.
Figure 2B:
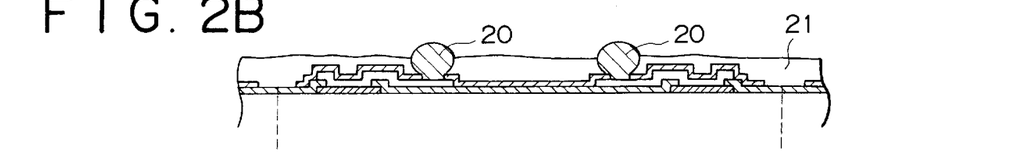
Figure 2C:
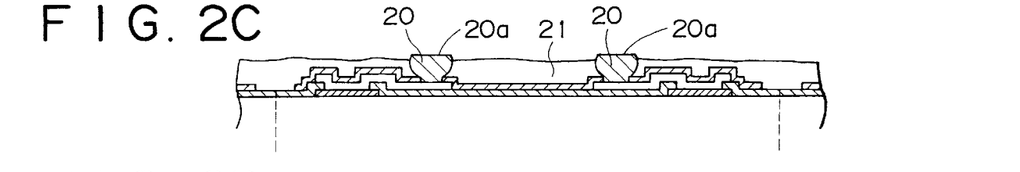

The manufacturing method in this embodiment is the same as that in the first embodiment except that after first solder ball bumps are formed and the entire surface of a semiconductor wafer is coated with a resin layer, the top portions of the first solder ball bumps are planarized by polishing (see FIG. 2C).

Referring first to FIG. 2A, an approximately spherical first solder ball bump 20 made from a high melting point solder is formed on each electrode portion 11a of each semiconductor IC 11 of a semiconductor wafer 10.

The first solder ball bump 20 is formed on a BLM film 15 exposed from an opening 16a of a polyimide film 16.

Referring to FIG. 2B, the entire surface of the semiconductor wafer 10 is coated with an epoxy resin 21 by spin coating. The semiconductor wafer 10 is then heat-treated at about 150° C. for about 5 hrs, whereby the resin 21 is cured.

Referring to FIG. 2C, the top portion of the first solder ball bump 20 is polished by a polishing apparatus, to be planarized. The planarized top portion of the first solder ball bump 20 is designated by reference numeral 20a.

The polishing apparatus will be described with reference to FIG. 3.

Figure 3:
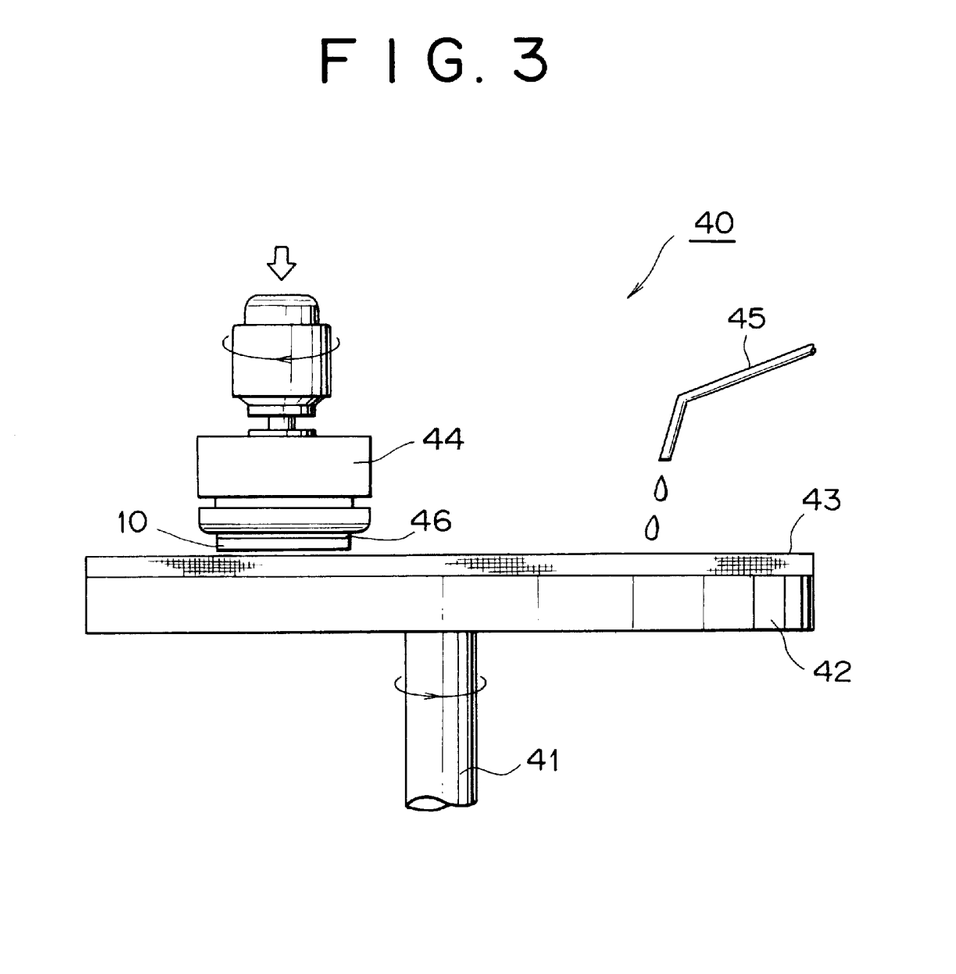
FIG. 3 is a schematic side view showing one configuration of a polishing apparatus used for the manufacturing method shown in FIGS. 2A to 2F.

Referring to FIG. 3, the polishing apparatus designated by reference numeral 40 includes a table 42 rotated by a rotating shaft 41, a polishing cloth 43 stuck on the upper surface of the table 42, a wafer carrier 44 which supports the semiconductor wafer 10 and is rotated, and a nozzle 45 for dripping a polishing solution on the table 42.

The wafer carrier 44 is rotated while pressing the semiconductor wafer 10 on the polishing cloth 43 on the table 42, to polish the top portions of the first solder ball bumps 20, which are the highest portions of the semiconductor wafer 10.

Referring back to FIG. 2D, a second solder ball bump 22 made from an eutectic solder is formed on the planarized top portion of the first solder ball bump 20 by a ball transfer process. At this time, the second solder ball bump 22 is bonded to the first solder ball bump 20. As a result, a solder bump 23 having a stacked structure of the first and second solder ball bumps 20 and 22 is formed.

Figure 2D:
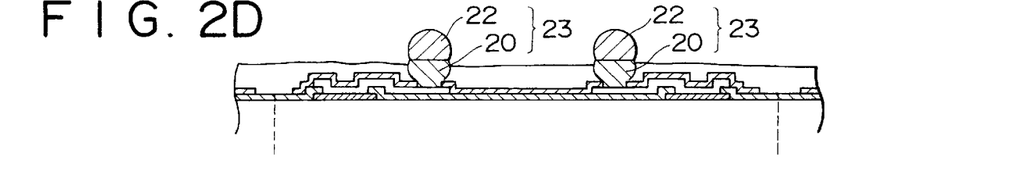

The semiconductor substrate 12 in the wafer state is then cut into the individual chip-like semiconductor ICs 11 by dicing. The semiconductor IC 11 is thus accomplished.

Figure 2E:
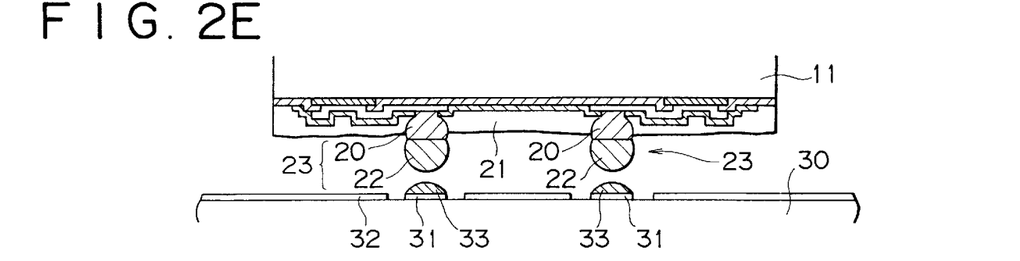

The semiconductor IC 11 thus manufactured is mounted on a printed circuit board 30 in the following procedure:

Referring to FIG. 2E, the flip-chip type semiconductor IC 11 is set such that each solder bump 23 faces to the associated one of lands 31 as connecting portions made from Cu formed on the printed circuit board 30.

The surface of the printed circuit board 30 is covered with a solder resist 32 excluding the surfaces of the lands 31, and the regions of the lands 31 are pre-coated with an eutectic solder film 33.

As shown in FIG. 2E, the semiconductor IC 11 is moved close to the printed circuit board 30 until each solder bump 23 is brought into contact with the associated one of the lands 31. Then, at the so-called reflow step, the eutectic solder film constituting the second solder ball bumps 22 and the eutectic solder film 33 pre-coated on the lands 31 formed on the printed circuit board 30 are melted, to be thus bonded to each other.

Figure 2F:
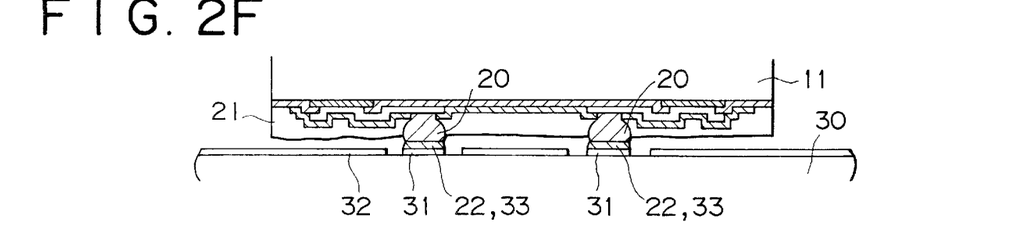

In this way, the flip-chip mounting of the flip-chip type semiconductor IC 11 to the printed circuit board 30 is terminated.

The embodiment having the above-described configuration has the following advantages:

Like the solder bump 23 in the first embodiment shown in FIGS. 1A to 1E, the second solder ball bump 22 formed of the eutectic solder film is strongly bonded to the eutectic solder film 33 pre-coated on the lands 31, so that the second solder ball bump 22 is certainly solder-bonded to the eutectic solder film 33.

Even if a thermal stress is applied between the semiconductor substrate 12 and the printed circuit board 30, the resin layer 21 fixedly holding the solder bumps 23 sustains the thermal stress as a whole and the first solder ball bumps 20 having a relatively high elasticity are elastically deformed, whereby the thermal stress is moderated. As a result, it is possible to prevent breakage of the bonding portions of the solder bumps 23 due to the thermal stress and hence to improve the reliability of the solder bumps.

Since the resin layer 21 is formed on the surface, on the electrode pad 13 side, of the semiconductor IC 11 before the semiconductor IC 11 is mounted to the printed circuit board 30, even if the semiconductor IC 11 has a narrow pitch structure, the entire surface of the semiconductor IC 11 is certainly covered with the resin layer 21. This makes it possible to certainly moderate a thermal stress, and hence to improve the durability against the thermal stress.

Since the top portion of the first solder ball bump 20 is polished, the resin 21 remaining on the top portion of the first solder ball bump 20 is perfectly removed. As a result, the top surface of the first solder ball bump 20 becomes a clean plane. The second solder ball bump 22 is formed on the clean plane of the first solder ball bump 20, to thereby reduce a connection resistance at the boundary between the first solder ball bump 20 and the second solder ball bump 22. This makes it possible to obtain the solder bump 23 having a lower resistance and a higher performance. Further, since the first solder ball bumps 20 are planarized by polishing, the heights of the solder bumps 23 are further equalized. This makes it possible to reduce occurrence of a mounting failure.

In this case, since the second solder ball bumps 22 are formed by the ball transfer process, the transfer amounts thereof are equalized, so that the heights of the solder bumps 23 are more accurately equalized.

As described above, according to the second embodiment, the reliability and durability of the flip-chip mounting of the semiconductor IC 11 to the printed circuit board 30 can be improved more than those in the first embodiment.

The second solder ball bumps 22 are formed by the screen printing or ball transfer process in the above-described embodiments; however, the present invention is not limited thereto, and it is to be understood that they may be formed by another printing or transfer process, or a plating process.

The solder bumps 23 are formed on the electrode pads of the semiconductor IC 11 in the above-described embodiments; however, the present invention is not limited thereto but is applicable to the case where solder bumps are formed on electrode pads of another semiconductor device.

The second solder ball bump is overlapped to the first solder ball bump in the above-described embodiments; however, one or a plurality of solder bumps may be overlapped thereto or interposed therebetween.

The first and second ball bumps made from the lead-containing solders different in composition are used in the above-described embodiment; however, they may be made from lead-free solders different in composition. Even in this case, the same effect can be obtained.

While the preferred embodiments of the present invention have been described using the specific terms, such description is for illustrative purposes only, and it is to be understood that changes and variations may be made without departing from the spirit or scope of the following claims.

What is claimed is:

1. A bump comprising:

a relatively elastic first ball bump formed on an electrode pad provided on a semiconductor device; and a second ball bump formed in such a manner as to be overlapped on said first ball bump at least in the direction perpendicular to said electrode pad, said second ball bump being different in material or composition from said first ball bump and being adapted to be in contact with a solder pre-coated on a connection land of a printed circuit board.

2. A bump according to claim 1, wherein said first ball bump is covered with a resin layer formed on the surface, on said electrode pad side, of said semiconductor device.

3. A bump according to claim 2, wherein the thickness of said resin layer is in a range of the height of said first ball bump or less.

4. A solder bump comprising:

a relatively elastic first solder ball bump formed on an electrode pad provided on a semiconductor device; and a second solder ball bump formed in such a manner as to be overlapped on said first solder ball bump at least in the direction perpendicular to said electrode pad, said second solder ball bump being different in material or composition from said first solder ball bump and being adapted to be in contact with a solder precoated on a connection land of a printed circuit board.

5. A solder bump according to claim 4, wherein said first solder ball bump is made from a high melting point solder, and said second solder ball bump is made from an eutectic solder.

6. A solder ball bump according to claim 4, wherein said first solder ball bump is covered with a resin layer formed on the surface, on said electrode pad side, of said semiconductor device.

7. A solder ball bump according to claim 6, wherein the thickness of said resin layer is in a range of the height of said first solder ball bump or less.

* * * * *